United States Patent [19]

Hennig

[11] 4,276,616

[45] Jun. 30, 1981

[54] MERGED BIPOLAR/FIELD-EFFECT BISTABLE MEMORY CELL

[75] Inventor: Falke Hennig, Monta Vista, Calif.

[73] Assignee: Fairchild Camera & Instrument Corp., Mountain View, Calif.

[21] Appl. No.: 32,045

[22] Filed: Apr. 23, 1979

[51] Int. Cl.³ .............................................. G11C 11/40
[52] U.S. Cl. ................................................... 365/177
[58] Field of Search ........................... 365/177; 357/43

[56] References Cited

U.S. PATENT DOCUMENTS

| 3,648,125 | 3/1972 | Peltzer | |
|---|---|---|---|
| 3,731,164 | 5/1973 | Cheney | 365/177 |
| 3,893,085 | 7/1975 | Hansen | |
| 4,090,254 | 5/1978 | Ho et al. | 365/177 |

FOREIGN PATENT DOCUMENTS 2631285  1/1978  Fed. Rep. of Germany ........... 365/177

OTHER PUBLICATIONS

Hibberd, "Integrated Circuits, a Basic Course for Engineers and Technicians", pp. 63–68, McGraw–Hill Book Company, 1969.
Sander, "FAM 15.4: a 4096X1(I³L) Bipolar Dynamic RAM", 1976 IEEE International Solid-State Circuits Conference.
Data sheet for F2114, "1024X4-Bit Static Random Access Memory, Fairchild Isoplanar Silicon Gate MOS Integrated Circuit", 8/74.

Primary Examiner—Stuart N. Hecker
Attorney, Agent, or Firm—Paul J. Winters; Ronald J. Meetin; Theodore S. Park

[57] ABSTRACT

A compact bistable semiconductor memory cell usable in static electronic information storage devices includes a field-effect transistor merged with a bipolar transistor for storing a binary information bit.

15 Claims, 5 Drawing Figures

MERGED BIPOLAR/FIELD-EFFECT BISTABLE MEMORY CELL

BACKGROUND OF THE INVENTION

1. Field of the Invention

This invention relates to electronic information storage devices containing bistable semiconductor memory cells.

2. Prior Art

Cellular electronic information storage devices operable in both the read mode and the write mode may be generally divided into two categories: static memories and dynamic memories. In a static memory consisting of one or more multistable static memory cells, data entered into the static memory does not degrade significantly with time. As long as power is supplied to the static memory, the information in the static memory cells remains essentially indefinitely or until a new pattern of information is written in. Conversely, in a dynamic memory consisting of one or more dynamic memory cells, the information entered into the dynamic memory does degrade with time. The dynamic memory must be periodically refreshed to maintain the data.

An electronic static memory cell in the prior art typically consists of a pair of cross-coupled transistor inverter stages and a load circuit arranged in a bistable configuration. The inverter stages are usually either a pair of bipolar transistors or a pair of metal-oxide semiconductor (MOS) field-effect transistors. The load devices for a static memory cell conventionally consists of two or more transistors and/or resistors. Prior art static memory cells are illustrated by R. G. Hibberd in *Integrated Circuits, A Basic Course for Engineers and Technicians* (McGraw-Hill Book Co., 1969), Lesson 4, Pages 63-68.

A disadvantage of the cross coupling in prior art static memory cells is that the cells occupy a relatively large amount of space on a semiconductor chip because many elements are utilized in each cell.

Under current five-micron design rules, a typical cross-coupled static memory cell occupies about 3.0 square mils; for a 4096-bit static memory, the total required chip space is approximately 20,000 square mils. Under upcoming three-micron design rules, a 4096-bit memory employing cross-coupled static memory cells would occupy about 7,000 square mils.

Conventional dynamic memories include MOS dynamic memories, charge-coupled devices, and bipolar integrated injection logic ($I^2L$) dynamic memories. Each cell in a typical MOS dynamic memory includes a storage capacitor for storing a data bit and an MOS field-effect transistor for accessing the storage capacitor. Each cell in a bipolar $I^2L$ dynamic memory has one bipolar transistor for storing a data bit and another bipolar transistor for supplying the stored charge.

In the prior art, dynamic memory cells usually require fewer elements than static memory cells and thus occupy less chip space. Dynamic memories also normally require less power to operate than static memories.

A disadvantage of dynamic memories is that a substantial amount of complex peripheral circuitry must be employed for periodically refreshing the memory cells. Dynamic memories within the prior art are thus harder to implement. Additionally, static memories are less noise sensitive and generally have shorter cycle times than dynamic memories.

One technique for reducing memory cell size is to merge some of the cell elements with one another. In the prior art bipolar static $I^2L$ technology, where the load circuit consists of at least two bipolar transistors, each of the cross-coupled inverter-stage transistors is merged with a corresponding load transistor. The inverter-stage transistor is of one type—for example, a PNP transistor—and the load transistor is of the opposite type—for example, an NPN transistor. Prior art dynamic memory cells employing merged elements include bipolar $I^2L$ memory cells in which the storage transistor is of one type—for example, an NPN transistor—and the transistor which supplies the stored charge is of the opposite type—for example, a PNP transistor. W. B. Sander, J. M. Early, and T. A. Longo, "A 4096×1 ($I^3L$)* Bipolar Dynamic RAM," *Digest of Technical Papers*, 1976, IEEE International Solid-State Circuits Conference Pages 182 and 183, illustrate a merged bipolar dynamic memory cell. (*$I^3L$ is a registered trademark of Fairchild Camera and Instrument Corporation).

SUMMARY OF THE INVENTION

In accordance with this invention, a compact bistable semiconductor memory cell usable in static electronic information storage devices operable in both the read and write modes includes a field-effect transistor merged with a bipolar transistor for storing a binary data bit. The base of the bipolar transistor is integral with the drain of the field-effect transistor. The collector of the bipolar transistor is coupled to the gate of the field-effect transistor. Cell load means, such as a cell resistor, may be coupled to a node between the collector and gate.

The field-effect transistor acts as a current-supply for the bipolar transistor. One stable state exists when the bipolar transistor is conducting, and another stable state exists when the bipolar transistor is not conducting.

In one embodiment, the bipolar transistor is an NPN transistor and the current-supply field-effect transistor is a depletion-mode P-channel metal-oxide (MOS) transistor. In another embodiment, the bipolar transistor is a PNP transistor and the current-supply transistor is a depletion-mode N-channel MOS transistor.

The present memory cell may be fabricated using three-micron design-rule technology. With three-micron design rules, the resulting cell size is approximately 0.35 square mils. This is approximately the same size as that of a prior art dynamic memory cell. For a 4096-bit static memory, the total chip size for a static memory in accordance with this invention is approximately 2,400 square mils. Thus, the chip size is approximately one-third the chip size theoretically available with a prior art static memory using three-micron design rules and cross-coupled transistor stages. In comparison to the cross-coupled static memory cells currently available using five-micron design rules, the present invention offers even a greater savings in chip space.

In short, the present memory cell offers the bistable operational advantages of static memory cells combined with the small size of dynamic memory cells without the complex and space-consuming peripheral circuitry required for periodically refreshing dynamic memory cells.

BRIEF DESCRIPTION OF THE DRAWINGS

Like reference numbers are employed in the drawings to represent the same item or items in the drawings and in the description of the preferred embodiments.

DESCRIPTION OF THE PREFERRED EMBODIMENTS

Figure 1:
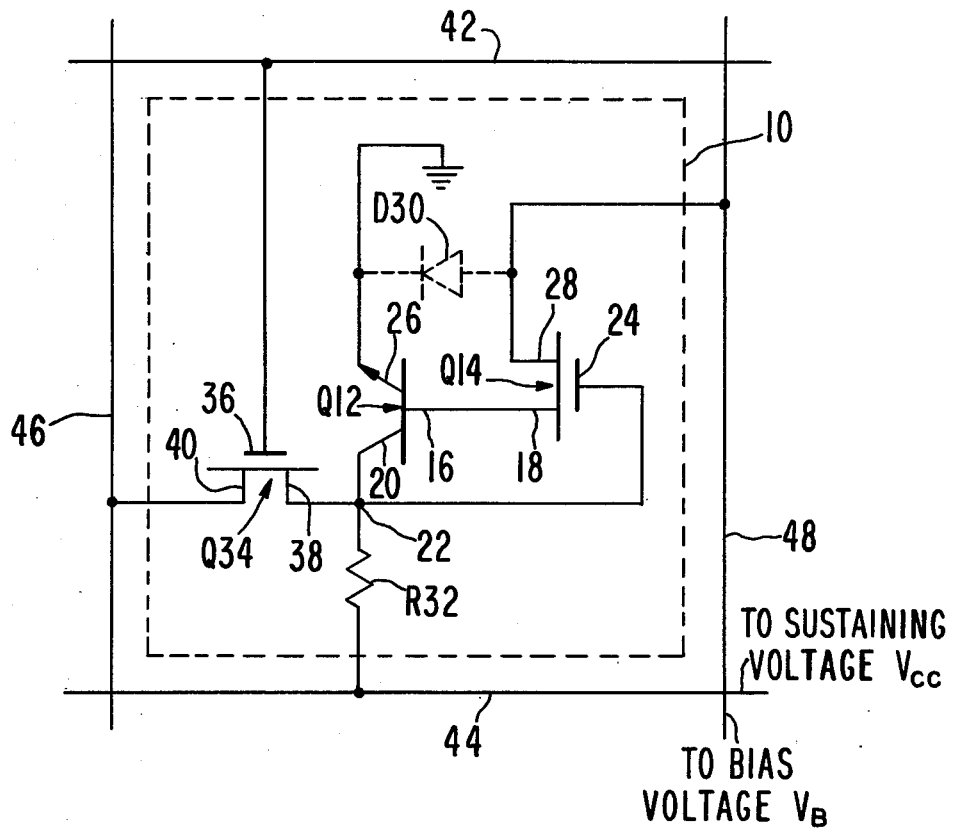
FIG. 1 is a circuit diagram of a memory cell used in an embodiment of the present invention.

Referring to the drawings, FIG. 1 shows a circuit drawing of an embodiment of a bistable semiconductor memory cell 10 used to store a binary information bit. Memory cell 10 comprises the elements enclosed within the dashed line. Also shown in FIG. 1 are external conducting lines utilized for operating memory cell 10. Memory cell 10 may be used in static information storage devices operable in both the read and write modes.

Within memory cell 10, the principal elements employed for storing a binary data bit are bipolar NPN transistor Q12 and P-channel depletion-mode MOS field-effect transistor Q14. Transistor Q14 acts as a current supply for transistor Q12.

Transistor Q12 is merged with transistor Q14, the base 16 of transistor Q12 being integral with the drain 18 of transistor Q14. The collector 20 of transistor Q12 is coupled through a node 22 to the gate electrode 24 of transistor Q14. The emitter 26 of transistor Q12 is connected to a substantially constant reference. In the embodiment of FIG. 1, emitter 26 is grounded. In some embodiments, the source 28 of transistor Q14 is coupled to emitter 26 by way of a parasitic diode D30. A cell resistor R32 which acts as a cell load element is coupled to collector 20 and gate electrode 24 through node 22.

The two stable states of bistable memory cell 10 are normally designated as the low logic or "0" state and the high logic or "1" state. One of the stable states exists when transistor Q12 is conducting, and the other stable state exists when transistor Q12 is turned off. It is herein defined that the low logic or "0" state exists in memory cell 10 when transistor Q12 is conducting and that the high logic or "1" state occurs when transistor Q12 is not conducting. Opposite definitions could be adopted as well.

Information-storage transistors Q12 and Q14 are accessed for read and/or write operation through an N-channel enhancement-mode MOS field-effect transistor Q34. Enhancement-mode access transistor Q34 is normally in the non-conducting state and conducts only when a voltage equal to or exceeding the threshold voltage is applied to the gate electrode 36 of transistor Q34. The gate threshold voltage for transistor Q34 is 1.0 volts in this embodiment. Alternatively, transistor Q34 could be a P-channel enhancement-mode MOS transistor or a depletion-mode MOS transistor having either a P channel or an N channel.

Access transistor Q34 has two source-drain elements 38 and 40 which interchangeably act as source and drain. In accordance with the foregoing definitions, when a "0" is to be written into memory cell 10, source-drain element 40 acts as the source and source-drain element 38 acts as the drain. Conversely, when a "1" is to be written into memory cell 10, source-drain element 38 acts as the source and source-drain element 40 acts as the drain. Source-drain element 38 is coupled through node 22 to collector 20 and to gate electrode 24.

As shown in FIG. 1, four electrical conducting lines (or line conductors) 42, 44, 46, and 48 are employed for controlling the operation of memory cell 10. Access line 42 is coupled to access gate electrode 36 for carrying a cell-selection signal to access memory cell 10. Data line 46 is coupled to source-drain element 40 for transmitting an information bit into memory cell 10 and for carrying an information bit indicating the state of memory cell 10. Source line 44 is coupled to node 22 through cell resistor R32 for carrying a sustaining voltage $V_{CC}$ to maintain the current stable state of memory cell 10. Source line 48 is coupled to source 28 for carrying a bias voltage $V_B$ to establish the desired operating conditions for memory cell 10.

Where transistor Q14 is a P-channel depletion-mode field-effect transistor, sustaining voltage $V_{CC}$ and bias voltage $V_B$ are both positive. Bias voltage $V_B$ is of a sufficiently great value to forward bias the base-emitter junction of transistor Q12. Transistor Q14 normally conducts and turns off only when a voltage equal to or greater than the gate threshold voltage is applied to gate electrode 24. Sustaining voltage $V_{CC}$ equals or exceeds the threshold voltage. In this embodiment, sustaining voltage $V_{CC}$ is approximately 5 volts, and bias voltage $V_B$ is approximately 0.8 volts; the gate threshold voltage for transistor Q14 is about 2.5 volts.

Transistors Q12 and Q14 operate in the following manner in the embodiment depicted in FIG. 1.

In the "0" state, transistor Q12 conducts so that current passes through resistor R32 causing a positive voltage drop across resistor R32. Resistor R32 is chosen to be of a sufficiently large value to pull collector 20 down to a low voltage below the threshold voltage for activating gate electrode 24. Since collector 20 is directly connected to gate electrode 24, this low voltage is applied to gate electrode 24 permitting transistor Q14 to conduct. With transistor Q14 conducting, bias voltage $V_B$, which is applied to source 28, is transmitted through transistor Q14 to base 16, causing transistor Q12 to conduct. Accordingly, the "0" state is stable with both transistors Q12 and Q14 conducting.

In the "1" state with transistor Q12 turned off, essentially no current flows through cell resistor R32 so that collector 20 is at a voltage equal to sustaining voltage $V_{CC}$. Since gate electrode 24 is directly coupled to collector 20, gate electrode 24 is likewise at sustaining voltage $V_{CC}$, forcing transistor Q14 into the non-conducting state. With transistor Q14 not conducting, no current is provided to base 16 of transistor Q12, causing transistor Q12 to remain in the non-conducting state. Thus, the "1" state is stable with both transistors Q12 and Q14 turned off.

To read the state of memory cell 10, a cell-selection voltage signal sufficient to activate gate electrode 36 is transmitted through access line 42 to gate electrode 36 bringing transistor Q34 into the conducting state. If memory cell 10 is in the "0" state so that transistor Q12 is conducting, collector 20 is at a low voltage. This low voltage is transmitted through transistor Q34 to data line 46 where the low voltage is read. On the other hand, when memory cell 10 is in the "1" state, so that collector 20 is at sustaining voltage $V_{CC}$, this high voltage is transmitted through transistor Q34 to data line 46 from which the high voltage is read.

To write into memory cell 10, a selection signal is again transmitted through line 42 to activate gate electrode 36, causing transistor Q34 to conduct. First, consider the situation where memory cell 10 is in the "0" state and a "1" is to be written into memory cell 10. Initially, both transistors Q12 and Q14 are conducting. A high voltage exceeding the threshold voltage for gate electrode 24 is applied to data line 46. With transistor Q34 conducting, this high voltage is transmitted through transistor Q34 to transistors Q12 and Q14 to raise simultaneously the voltages of collector 20 and gate electrode 24. Since the high voltage exceeds the threshold voltage for gate electrode 24, transistor Q14 starts to turn off. As transistor Q14 turns off, the current transmitted from transistor Q14 to base 16 decreases, causing transistor Q12 to start to turn off. As transistor Q12 turns off, the voltage across transistor Q12 between grounded emitter 26 and collector 20 rises to the high voltage applied through data line 46. Memory cell 10 then switches from the "0" state to the "1" state.

Next, consider the case where memory cell 10 is in the "1" state and a "0" is to be written in. Initially, both transistors Q12 and Q14 are turned off. A low voltage below the threshold voltage of gate electrode 24 is applied to data line 46 and through transistor Q34 to gate electrode 24. Since this low voltage is below the threshold voltage for gate electrode 24, transistor Q14 starts to turn on. As transistor Q14 turns on, it causes transistor Q12 to turn on by supplying current to base 16. As transistor Q12 turns on, the emitter-collector voltage for transistor Q12 drops to the low voltage applied through data line 46, placing memory cell 10 in the "0" state.

In an alternative embodiment, transistor Q12 is a bipolar PNP transistor and transistor Q14 is an N-channel depletion-mode MOS field-effect transistor. Sustaining voltage $V_{CC}$ has a negative value of, for example, about $-5$ volts. $V_B$ also has a slight negative value of, for example, about $-0.8$ volts. Operation in this alternative embodiment is the same as that described for the foregoing embodiment illustrated in FIG. 1, except that the polarities of the various voltages are inverted and current flows are in the opposite directions.

While the invention has been described with reference to embodiments having access transistor Q34 as an element of memory cell 10, memory cell 10 could as well be defined as not including transistor Q34; in this case, memory cell 10 would comprise transistors Q12 and Q14 (and diode D30) and resistor R32, all of which would be accessed through transistor Q34. Additionally, other types of field-effect transistors may be used for current-supply transistor Q14 in lieu of the depletion-mode MOS transistors described above. A transistor might be used as the cell load element in lieu of resistor R32.

Figure 2:
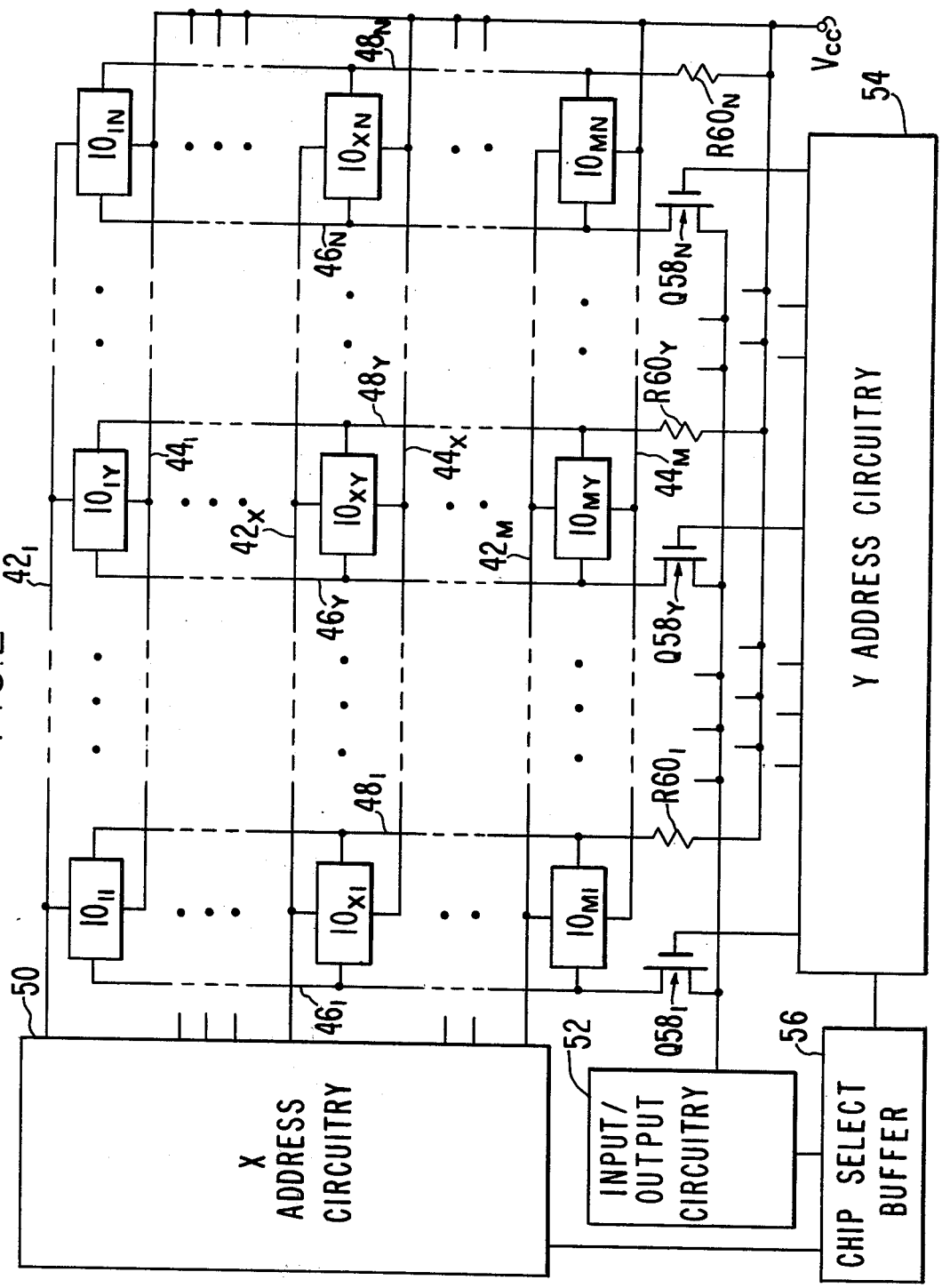
FIG. 2 is a schematic of an information-storage device containing a memory array employing the memory cell of FIG. 1.

Memory cell 10 described above and illustrated in embodiment in FIG. 1 is typically one of one or more similar cells employed in the static memory matrix of an electronic information-storage device. FIG. 2 depicts a circuit and block diagram of an embodiment of such an information-storage device. The memory cells in FIG. 2 are arranged in a memory array of M rows of cells and N columns of cells. M and N are positive integers. Use of a rectangular storage array is for illustrative purposes only. Other types of storage arrays, such as, for example, linear arrays, or arrays of any other operative configuration may be employed with the invention.

The memory cells in any row X are labeled $10_{X1}$, $10_{X2} \ldots 10_{XY} \ldots 10_{XN}$, where "X" is the number of the row. X varies from 1 to M. The cells in any column Y are labeled $10_{1Y}, 10_{2Y} \ldots 10_{XY} \ldots 10_{MY}$, where "Y" is the number of the column. Y varies from 1 to N. "X" is thus indicative of the circuitry associated with the rows of cells, and "Y" is indicative of the circuitry associated with the columns of cells. An arbitrary cell in the matrix is labeled $10_{XY}$. Each memory cell $10_{XY}$ in FIG. 2 corresponds to, and contains the elements previously described for, memory cell 10 of FIG. 1.

All the cells $10_{X1}, 10_{X2} \ldots 10_{XY} \ldots 10_{XN}$ in row X are coupled to access line $42_X$ and to source line $44_X$. Similarly, all the cells $10_{1Y}, 10_{2Y} \ldots 10_{XY} \ldots 10_{MY}$ in column Y are coupled to data line $46_Y$ and to source line $48_Y$. Lines $42_X$, $44_X$, $46_Y$, and $48_Y$ in FIG. 2 correspond, respectively, to lines 42, 44, 46, and 48 in FIG. 1.

The information-storage device of FIG. 2 contains row (or X) address circuitry 50, input/output circuitry 52, and column (or Y) address circuitry 54. A chip select buffer 56 cuts off power selectively to X address circuitry 50, input/output circuitry 52, and Y address circuitry 54 during standby periods.

X address circuitry 50 is coupled to access lines $42_1 \ldots 42_X \ldots 42_M$. Contained in X address circuitry 50 are row address buffers and a row decoder connected in a conventional manner.

Input/output circuitry 52 is coupled through column N-channel enhancement-mode MOS field-effect transistors $Q58_1 \ldots Q58_Y \ldots Q58_N$ to data lines $46_1 \ldots 46_Y \ldots 46_N$, respectively. Column transistors $Q58_1 \ldots Q58_N$ each have a pair of source-drain elements which function interchangeably as the sources and drains for column transistors $Q58_1 \ldots Q58_N$ depending on whether current is being transmitted up or down data lines $46_1 \ldots 46_N$. In particular, input/output circuitry 52 is coupled through each pair of source-drain elements of transistor $Q58_Y$ to the corresponding data line $46_Y$. Input/output circuitry 52 comprises an input buffer, an output buffer, a sense amplifier, and a read/write buffer all connected in a conventional manner.

Y address circuitry 54 is coupled to the gate electrodes of column transistors $Q58_1 \ldots Q58_N$. Included in Y address circuitry are column address buffers and a column decoder connected in a conventional manner.

X address circuitry 50, input/output circuitry 52, Y address circuitry 54, and chip select buffer 56 are all conventional items such as those utilized in 1024 by 4-bit static random-access memory manufactured by Fairchild Camera and Instrument Corporation and designated by product No. F2114. The operation of these items is likewise known in the prior art. In particular, see 1978 F2114 Data Sheet, issued by Fairchild Camera and Instrument Corporation. This data sheet is specifically incorporated by reference herein.

The information-storage device of FIG. 2 operates in the following manner. A particular cell $10_{XY}$ is selected for read/write operation by addressing the particular row X and the particular column Y. To address row X, X address signals are applied to X address circuitry 50 which, in turn, supplies an appropriate signal along access line $42_X$ to enable the access transistors for cells $10_{X1} \ldots 10_{XN}$ in selected row X. To address column Y, Y address signals are applied to Y address circuitry 54 which provides an appropriate signal to enable transistor $Q58_Y$ in selected column Y. These signals select particular cell $10_{XY}$ at the intersection of row X and column Y. Input/output circuitry 52 then either reads the state of cell $10_{XY}$ along data line $46_Y$ or writes a new data bit into cell $10_{XY}$ along data line $46_Y$.

As shown in FIG. 2, each of source lines $44_1 \ldots 44_X \ldots 44_M$ are coupled to a conventional current/voltage source which provides a substantially constant voltage equal to sustaining voltage $V_{CC}$. Source lines $48_1 \ldots 48_Y \ldots 48_N$ are coupled through column resistors $R60_1 \ldots R60_Y \ldots R60_N$, respectively, to the current/voltage source producing sustaining voltage $V_{CC}$. Column resistors $R60_1 \ldots R60_N$ are each substantially identical to one another. Bias voltage $V_B$ is produced for each column Y from sustaining voltage $V_{CC}$ by the voltage change across column resistor $R60_Y$.

Figure 3:
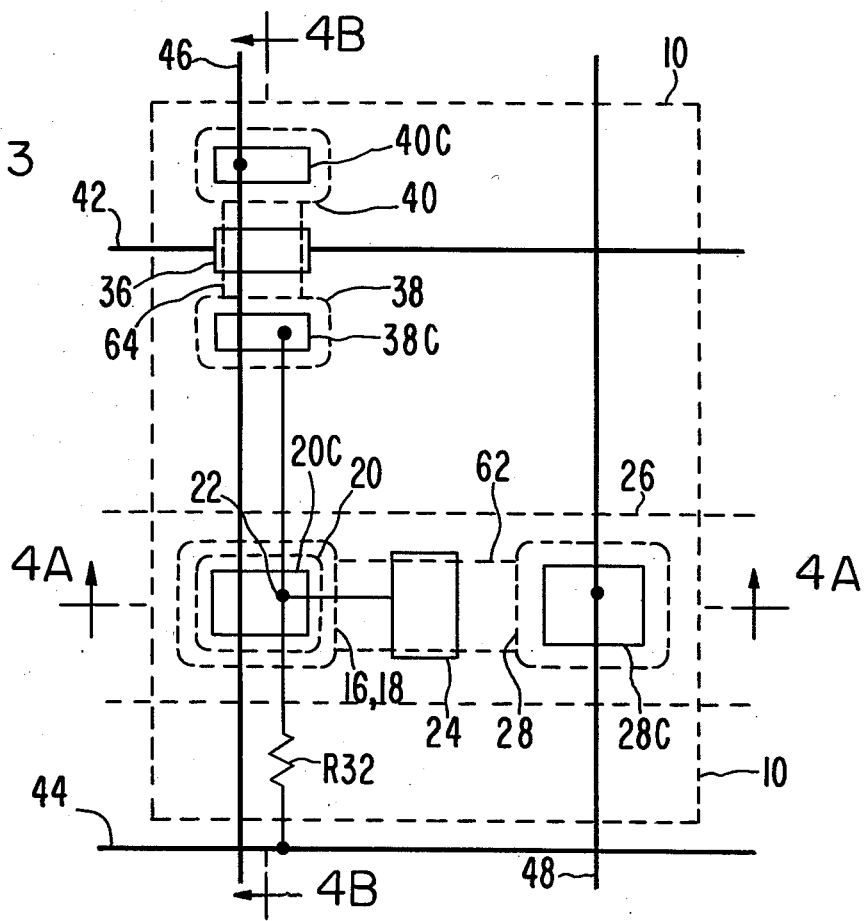
FIG. 3 is a topographical view of the memory cell of FIG. 1.

FIG. 3 shows a topographical view, partly schematic, for a preferred embodiment of memory cell 10 as viewed from above. Conducting lines 42, 44, 46, and 48, the internal conducting lines joining various underlying cell components, and the conductor contacts to underlying cell components are shown in solid lines in FIG. 3. Likewise, cell resistor R32 and gate electrodes 24 and 36 are depicted with solid lines. The underlying cell components for transistors Q12, Q14, and Q34 are shown by dotted lines. Items 20C, 28C, 38C, and 40C are the conductor contacts to underlying collector 20, source 28, and source-drain elements 38 and 40.

Base 16 for transistor Q12 and drain 18 for transistor Q14 are shown as the same item since base 16 and drain 18 are integral with each other. Item 62 is the P-channel lying below gate electrode 24 in transistor Q14. Similarly, item 64 is the N-channel lying below gate electrode 36 for transistor Q34. As illustrated in FIG. 3, transistors Q12 and Q14 are merged together in one portion of memory cell 10 while transistor Q34 is located in another portion of memory cell 10.

Figure 4A:
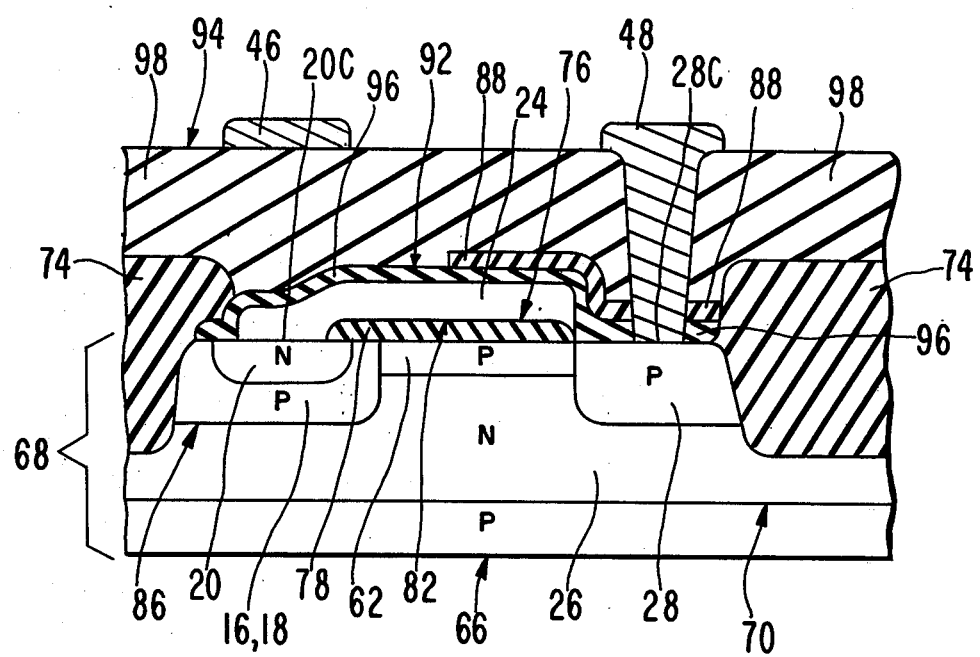
FIGS. 4a and 4b are cross-sectional views, partly schematic, of portions of the memory cell shown in FIGS. 1 and 3.
Figure 4B:
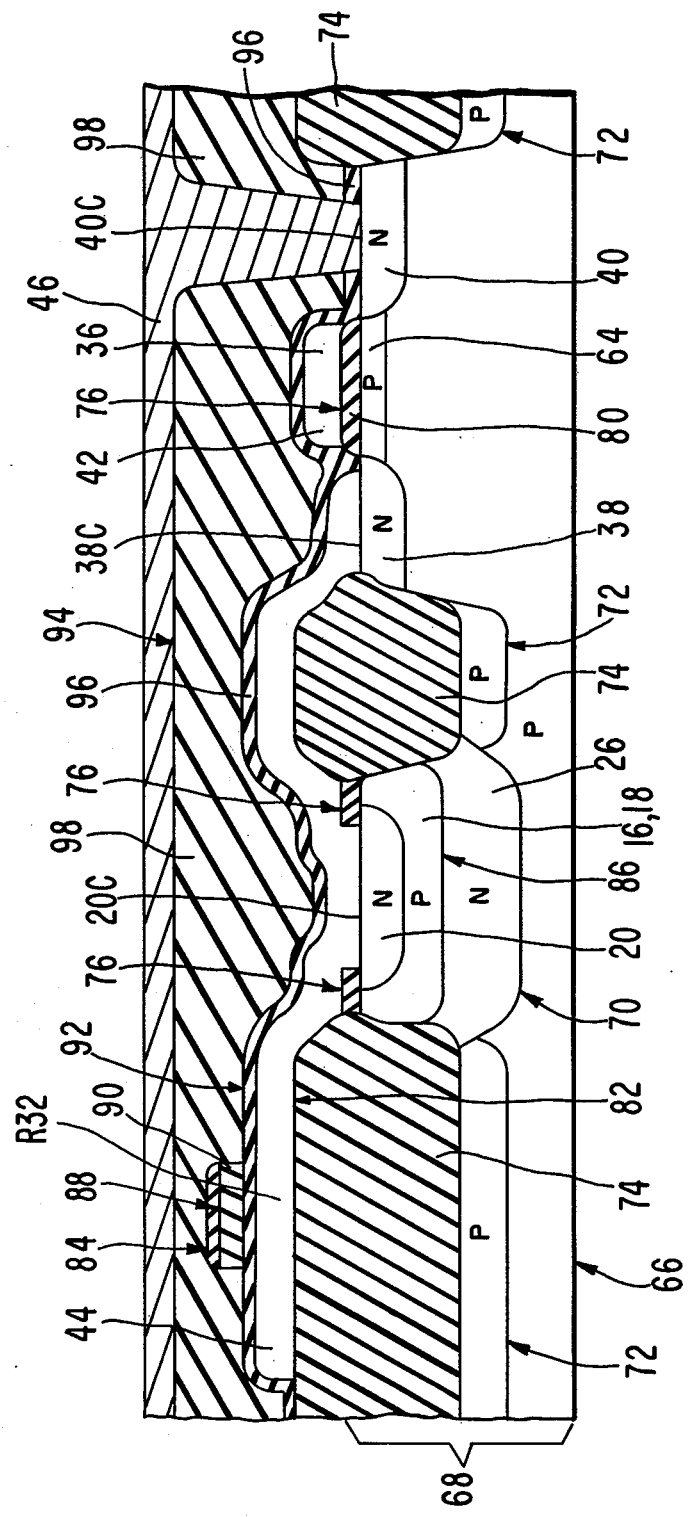

FIGS. 4a and 4b display cross-sectional views of sections of memory cell 10 for illustrating its fabrication on a semiconductor wafer. The cross sections are taken through the planes indicated by the arrows in FIG. 3. Conventional masking, etching, and cleaning techniques are employed in creating the various P-type, N-type, electrode, and insulating regions shown in FIGS. 4a and 4b. To simplify the discussion, references to the masking, etching, cleaning, and other well-known steps in the semiconductor prior art are omitted from the following fabrication discussion.

Oxide-isolation techniques similar to those disclosed in U.S. Pat. No. 3,648,125 on an invention of D. L. Peltzer entitled "Method of Fabricating Integrated Circuits with Oxidized Isolation and the Resulting Structure" are employed in separating selected regions in the wafer from one another. The techniques disclosed therein and particularly in columns 6 and 7 of U.S. Pat. No. 3,648,125 are specifically incorporated by reference herein.

Boron is normally utilized as the P-type impurity for creating the various regions of P-type conductivity in the wafer. Phosphorus, arsenic, and antimony are used selectively as complementary N-type dopants in the wafer. Other appropriate impurities may be used in place of these dopants. In many of the diffusion steps below, the impurities may generally be introduced to the wafer alternatively by ion-implantation methods.

The starting material for forming memory cell 10 is a silicon substrate 66 of P-type semiconductor material having an original thickness indicated by item 68. The resistivity of substrate 66 is 10 to 20 ohm-centimeters.

An N well 70 is formed in substrate 66 by diffusing an N-type impurity (phosphorus) into those portions of substrate 66 which later include transistors Q12 and Q14. The sheet resistance of N well 70 is about 800 ohms per square. A portion of N well 70 will constitute emitter 26. Since emitter 26 is grounded, N well 70 extends beyond the immediate vicinity of memory cell 10 to a grounding connection.

A standard P-type ion implantation is performed in those portions of substrate 66 that will not contain active elements to create more heavily doped P regions 72 for preventing surface inversion. The well-known silicon nitride technique is used to define the active areas of the wafer. Oxide isolation regions 74 are then formed in substrate 66 for electrically isolating selected portions of the wafer.

The top surface of the wafer is thermally oxidized to form a thin insulation layer 76 of silicon dioxide. Insulation layer 76 has a thickness of approximately 1,000 angstroms. Layer 76 later serves as the gate dielectrics 78 and 80 for field-effect transistors Q14 and Q34, respectively.

In growing a silicon dioxide layer such as layer 76, silicon dioxide also grows at the silicon dioxide-silicon interfaces of other portions of the wafer that already contain silicon dioxide such as oxide isolation regions 74. These additional oxide growths do not significantly affect the electrical properties of memory cell 10. To simplify the discussion herein, the additional oxide growths are not illustrated in the drawings and will not be further referred to herein. Similarly, no reference will be made to a corresponding removal of silicon dioxide from a portion of the wafer having an additional oxide growth at a prior-existing region of silicon dioxide.

Holes are etched through layer 76 to define areas for subsequent buried contacts between selected cell components and polycrystalline silicon electrical connections. The areas exposed by this etching correspond to collector contact 20C and source-drain contact 38C.

A P-type impurity is implanted through the portion of layer 76 corresponding to gate dielectric 78 to create channel region 62 for transistor Q14. Another P-type implant is performed through other portions of layer 76 to create channel region 64 for transistor Q34 and to create channel regions for some field-effect transistors in the peripheral circuitry. A similar N-type (phosphorus) ion implantation is performed through layer 76 on other portions of the wafer to define channel regions for other field-effect transistors in the peripheral circuitry for memory cell 10. These P-type and N-type implantations establish the desired threshold voltages for transistors Q14 and Q34 and the various other field-effect transistors.

A layer 82 of polycrystalline silicon having a thickness of approximately 6,000 angstroms is deposited on the wafer. An N-type impurity (phosphorous) is implanted into layer 82 to set the resistivity for polycrystalline silicon resistor R32. The ion implantation dose is approximately $10^{14}$ ions per square centimeter. Silicon layer 82 is then removed everywhere from the top surface of the wafer except where portions of layer 82 remain for electrical interconnections, gate electrodes 24 and 36, polycrystalline silicon resistor R32, and gate electrodes of peripheral field-effect transistors.

The remaining portions of silicon layer 82 are thermally oxidized to create an insulation layer 84 of silicon dioxide having a thickness of approximately 1,000 angstroms. Layer 84 is then removed from the area above gate dielectric 78 and the areas above source region 28 and a region 86. This leaves gate dielectric 78 in the desired shape.

A selective P-type diffusion is performed into regions 28 and 86. The sheet resistance of regions 28 and 86 is about 300 ohms per square.

The portions of silicon layer 82 then existing are thermally oxidized again to create an insulation layer 88 of silicon dioxide having a thickness of about 3,000 angstroms. Insulation layer 88 and the remaining portions of insulation layer 84 are removed everywhere except where they overlie resistor R32, source region 28, and a portion of gate electrode 24 nearest source region 28. The resultant portion of layers 84 and 88 above resistor R32 is indicated as item 90. This step leaves gate dielectric 80 in the desired form.

An N-type impurity (phosphorous) is selectively diffused to create collector region 20 for transistor Q12 and source-drain regions 38 and 40 for transistor Q14. The sheet resistance of regions 20, 38, and 40 is approximately 40 ohms per square. Silicon dioxide region 90 prevents diffusion into the region of resistor R32.

The various N-type and P-type diffusions also increase the conductivity of the remaining portions of silicon layer 82 except for that portion corresponding to resistor R32.

Emitter region 26 for transistor Q12 then comprises region 70 excluding regions 86, 62, and 28. Integral base 16/drain 18 comprises region 86 excluding region 20.

Another thermal oxidation is performed on the wafer to create insulation layer 92 of silicon dioxide. The finally remaining portions of polycrystalline silicon layer 82 then constitute the various internal electrical interconnections, gate electrodes 24 and 36, resistor R32, access line 42, and source line 44.

According to conventional techniques, a layer 94 of heavily phosphorus-doped silicon dioxide is deposited upon the wafer and heated to create a smooth upper surface. Holes are selectively etched through layers 92 and 94 to define the electrical contact areas corresponding to source contact 28C and source-drain contact 40C. The portions of layer 92 remaining after this etching are labeled as items 96, and the portions of layer 94 remaining are labeled as items 98. Aluminum is deposited on the wafer and in these holes and then selectively etched to form source contact 28C, source-drain contact 40C, data line 46, source line 48, and various peripheral interconnect lines.

All other transistors, resistors, and other components of the invention may be fabricated in the manner described above for transistors Q12, Q14, and Q34 and resistor R32. Semiconductor materials of the opposite conductivity type to those described above may be employed to accomplish the same results.

Memory cell 10 may be manufactured according to semiconductor-on-insulating-substrate techniques such as silicon-on-sapphire techniques in which an electrical insulator such as sapphire having a layer of a semiconductor material such as undoped silicon thereon is used as the starting material instead of silicon substrate 66; the fabrication procedure is substantially as described above except that a P-type well is formed below transistor Q34.

While the invention has been described with reference to particular embodiments, the description is solely for the purpose of illustration and is not to be construed as limiting the scope of the invention claimed below.

For example, other types of current-supply field-effect transistors may be used in the memory cell of the invention in place of the P-channel or N-channel MOS current-supply transistor utilized in the foregoing description. Thus, various modifications, changes and applications may be made by those skilled in the art without departing from the true scope and spirit of the invention as defined by the appended claims.

I claim:

1. A semiconductor memory cell comprising:
   a bipolar transistor having an emitter, a base, and a collector, said cell being bistable, a first stable state existing in said cell when said bipolar transistor is conducting and a second stable state existing in said cell when said bipolar transistor is substantially not conducting; and
   a current-supply field-effect transistor having a source, a gate electrode, and a drain, said base integral with said drain and said collector coupled to said gate electrode.

2. A semiconductor memory cell according to claim 1 and further including cell load means connected to a node between said collector and said gate electrode.

3. A semiconductor memory cell according to claim 2 wherein said cell load means is a resistor.

4. A semiconductor memory cell according to claim 1, 2, or 3 wherein said emitter is coupled to a substantially constant reference.

5. A semiconductor memory cell according to claim 2 and further including an access field-effect transistor having a first source-drain element, an access gate electrode, and a second source-drain element, said first source-drain element coupled to said node.

6. A semiconductor memory cell according to claim 5 wherein said emitter and said source form a parasitic diode.

7. A semiconductor cell according to claim 5 and further including:
   an access line conductor coupled to said access gate electrode for accessing said cell;
   a data line conductor coupled to said second source-drain element for transmitting an input data bit to be written into said cell and for transmitting an output data bit indicative of the state of said cell;
   a first source line conductor coupled to said node through said cell load means for carrying a voltage to sustain the state of said cell; and
   a second source line conductor coupled to said source for carrying a bias voltage to establish desired operating conditions for said cell.

8. A semiconductor memory cell according to claim 1, 2, 3, 5, or 7 wherein said bipolar transistor is an NPN transistor and said current-supply transistor is a depletion-mode P-channel metal-oxide semiconductor transistor.

9. A semiconductor memory cell according to claim 1, 2, 3, 5, or 7 wherein said bipolar transistor is a PNP transistor and said current-supply transistor is a depletion-mode N-channel metal-oxide semiconductor transistor.

10. An electronic circuit for data storage having: a plurality of semiconductor memory cells arranged in an array of M rows and N columns where M and N are positive integers; row-addressing means for selecting each of said rows and for sending row-selection signals to address each selected row; column-addressing means for selecting each of said columns and for sending column-selection signals to address each selected column;

input/output means for writing binary data bits into and reading binary data bits from the cell at the intersection of each selected row and each selected column; and current/voltage source means for providing sustaining voltage to maintain the stable states of each cell and for providing bias voltage to said cells to establish desired operating conditions; characterized in that each cell is as recited in claim 5.

11. An electronic circuit according to claim 10 characterized in that:

said row-addressing means includes M access line conductors corresponding on a one-to-one basis to said M rows, each access line conductor coupled to the access gate electrodes of the access transistors for the cells of the corresponding row;

said column-addressing means and said input/output means together include N data line conductors corresponding on a one-to-one basis to said N columns, each data line conductor coupled to the second source/drain elements of the access transistors of the cells of the corresponding column; and said current/voltage source means includes:

(1) M first source line conductors corresponding on a one-to-one basis to said M rows, each first source line conductor coupled to the nodes through the cell load means of the cells in the corresponding row for transmitting said sustaining voltage to the cells in said corresponding row;

(2) N second source line conductors corresponding on a one-to-one basis to said N columns each second source line conductor coupled to the sources of the current-supply transistors for the cells of the corresponding column for transmitting said bias voltage to the bipolar transistor and the current-supply transistor in each cell of the corresponding column;

(3) a current/voltage source for providing a substantially constant first voltage, said first voltage constituting said sustaining voltage; and (4) N column load means corresponding on a one-to-one basis to said N columns, each column load means coupled between said current/voltage source and the second source line conductor for the corresponding column for establishing said bias voltage.

12. An electronic circuit according to claim 11 characterized in that each of said column load means is a resistor.

13. A semiconductor memory cell according to claim 8 wherein said current-supply transistor conducts in the first stable state and substantially does not conduct in the second stable state.

14. A semiconductor memory cell according to claim 9 wherein said current-supply transistor conducts in the first stable state and substantially does not conduct in the second stable state.

15. A memory cell comprising:

a bipolar transistor having a first emitter/collector, a base, and a second emitter/collector, said cell being bistable, a first stable state existing in said cell when said bipolar transistor is conducting and a second stable state existing in said cell when said bipolar transistor is substantially not conducting; and a field-effect transistor having a source, a gate electrode, and a drain, said base integral with said drain and said second emitter/collector coupled to said gate electrode.

* * * * *